(12) United States Patent
Guilley et al.

(10) Patent No.: US 10,571,313 B2
(45) Date of Patent: Feb. 25, 2020

(54) DEVICE AND METHOD FOR CALIBRATING A DIGITAL SENSOR

(71) Applicant: SECURE-IC SAS, Cesson-Sévigné (FR)

(72) Inventors: Sylvain Guilley, Paris (FR); Thibault Porteboeuf, Paris (FR)

(73) Assignee: SECURE-IC SAS, Cesson-Sevigne (FR)

( * ) Notice: Subject to any disclaimer, the term of this patent is extended or adjusted under 35 U.S.C. 154(b) by 549 days.

(21) Appl. No.: 15/321,511

(22) PCT Filed: Jun. 26, 2015

(86) PCT No.: PCT/EP2015/064599
§ 371 (c)(1),
(2) Date: Dec. 22, 2016

(87) PCT Pub. No.: WO2015/197853
PCT Pub. Date: Dec. 30, 2015

(65) Prior Publication Data
US 2017/0160112 A1 Jun. 8, 2017

(30) Foreign Application Priority Data
Jun. 27, 2014 (EP) .................................... 14306036

(51) Int. Cl.
*G01D 18/00* (2006.01)
*G01R 31/30* (2006.01)

(52) U.S. Cl.
CPC ......... *G01D 18/00* (2013.01); *G01R 31/3016* (2013.01)

(58) Field of Classification Search
None
See application file for complete search history.

(56) References Cited

U.S. PATENT DOCUMENTS

| 4,266,218 A * | 5/1981 | Kardash ................ G08B 29/18 |
| | | 250/381 |
| 2013/0300463 A1 | 11/2013 | Gemmeke et al. |
| 2017/0117946 A1* | 4/2017 | Lee ...................... H04B 7/0617 |
| 2018/0054163 A1* | 2/2018 | Chen ...................... H03B 5/32 |

OTHER PUBLICATIONS

Shreyas Rao, Texas Instruments, Solving CMOS transition rate issues using Schmitt triggers, publication May 2017, 13 pages (Year: 2017).*
Introduction to the Two-Wire Transmitter and the 4-20mA Current Loop describes printed on Oct. 30, 2019, 10 pages (Year: 2019).*

(Continued)

*Primary Examiner* — Tung S Lau
(74) *Attorney, Agent, or Firm* — Meagher Emanuel Laks Goldberg & Liao, LLP

(57) ABSTRACT

There is provided a calibration device for calibrating a digital sensor (3), said digital sensor being configured to protest a target digital circuit (30) fed by a clock signal having a clock period by triggering an alarm depending on a condition between said clock signal and an optimal alarm threshold, said optimal alarm threshold being determined by minimizing a quantity depending on the probability of occurrence of false positives and on the probability of occurrence of false negatives.

15 Claims, 4 Drawing Sheets

(56) References Cited

OTHER PUBLICATIONS

International Search Report for PCT/EP2015/064599, dated Sep. 15, 2015.
Written Opinion for PCT/EP2015/064599, dated Sep. 15, 2015.
Nimay Shah et al., "Built-In Proactive Tuning System for Circuit Aging Resilience", Defect and Fault Tolerance of VLSI Systems, 2008. DFTVS '08. IEEE International Symposium on, IEEE, Piscataway, NJ USA, Oct. 1, 2008. (Oct. 1, 2008), pp. 96-104.
Sheng Wei et al., "Integrated Circuit Security Techniques Using Variable Supply Voltage", Design Automation Conference (DAC), 2001 48th ACM/EDAC/IEEE, Jun. 5, 2011 (Jun. 5, 2011), pp. 248-253.
Toshinori Sato et al., "A Simple Flip-Flop Circuit for Typical-Case Designs for DFM", Quality Electronic Design, 2007. ISQED '07. 8th International Symposium on, IEEE, PI, Mar. 1, 2007 (Mar. 1, 2007), pp. 539-544.
N. Selmane et al., "WDDL is Protected Against Setup Time Violation Attacks", 2009 Workshop on Fault Diagnosis and Tolerance in Cryptography, IEEE Computer Society, 2009, pp. 73-83.
N. Selmane et al., "Security evaluation of application-specific integrated circuits and field programmable gate arrays against setup time violation attacks", IET Information Security, 2010, vol. 5, Iss. 4, pp. 181-190.

* cited by examiner

DEVICE AND METHOD FOR CALIBRATING A DIGITAL SENSOR

BACKGROUND

The invention generally relates to digital circuits, and in particular to methods, systems, and computer program products for calibrating a digital sensor configured to protect a target digital circuit by triggering an alarm.

The correctness of computations in a digital circuit depends on several physical and environmental parameters generally referred to as "operating conditions". Improper operating conditions may lead to a digital circuit outputting partially or totally bogus results and/or internal states. Since this phenomenon is produced by out-of-specifications operating conditions, they are often out of the designer's scope and may yield unexpected behavior.

Attackers willing to gain control of sensitive assets from a targeted digital circuit such as a smartcard, a microprocessor, an ASIC (acronym for Application-Specific Integrated Circuit) or a FPGA (acronym for Field Programmable Gate Array) may use crafted out-of-specifications operating conditions to trigger a more or less loosely controlled unexpected behavior. This behavior may be characterized by the disclosure of sensitive assets such as cryptographic keys, the failure of one or more sensitive functions such as updating a sensitive value in a non-volatile memory, or the failure of an access control policy which results for example in granting access without correct credentials.

Protecting embedded systems against such attacks has thus become paramount for many applications requiring protection of sensitive assets.

As shown in FIG. 1, a digital circuit 1 mainly comprise previous memory elements 10 and next memory elements 12 interconnected by combinatorial standard cells 11. The memory elements 10 and 12 are responsible for storing input, intermediate and output values, and the combinatorial standard cells 11 are responsible for computing the value to be stored in the next memory elements 12, taking as input values the signals stored in the previous memory elements 10. Combinatorial standard cells include memory less logic gates that may implement Boolean functions such as invertors, or, and, xor. Other combinatorial standard cells may include buffers whose function is to amplify and/or delay some data path.

The memory elements 10 and 12 may be updated synchronously. The synchronization is generally achieved by means of a special signal referred to as the clock signal 13, for example by using its rising edge as a trigger event.

In order for the memory elements 10 and 12 to correctly sample a value, the value must be set and stable for some delay at the memory element input port before the clock rising edge (this delay is referred to as the "setup time"). Additionally, the memory element input signal must also be kept stable for some delay after the trigger event or clock rising edge (this delay is referred to as the "hold time").

The logic standard cells 12 between the memory elements form a set of data path. Every data path displays a propagation delay corresponding to the time required for a change of an input signal to be propagated through the standard cells 12 to the output of the data path. The data path displaying the greatest propagation delay represents the critical path.

Violation of the setup time is a common source of faulty computations in digital circuits and one of the common techniques exploited by attackers for performing fault injection. Setup time violation may arise because the propagation delay in the data path is too long for the modifications to be propagated and stable early enough before the clock rising edge.

In order to address this threat, a digital sensor architecture for protecting a digital circuit has been proposed by N. Selmane, S. Bhasin, S. Guilley, T. Graba and J.-L. Danger in "WDDL is Protected Against Setup Time Violation Attacks", FDTC 2009 and still improved in the article "Security evaluation of application-specific integrated circuits and field programmable gate arrays against setup time violation attacks" by N. Selmane, S. Bhasin, S. Guilley and J.-L. Danger in IET Information Security 2010. FIG. 2 illustrates such digital sensor 2. The digital sensor 2 comprises a digital circuit having an input memory element 20 for storing a reference data, a data path 22 for propagating the reference data and an output memory element 23 for storing the data propagated through the data path 22. The computation is deemed successful if the reference data correctly arrives from the input memory element 20 to the output memory element in time for being sampled, that is to say within less than a clock cycle. Such a digital circuit may be further used to detect abnormal operating conditions. Such a circuit is built with the same logic elements than any other digital circuits. It is therefore also sensitive to out-of-specifications operating conditions. For example, if the temperature increases above a given threshold, the propagation delays of the combinatorial gates in the digital sensor data path 22 will increase to the point where the data reaches the output memory element 23 after the clock rising edge. This late arrival may induce a faulty state in the output memory element 23 with respect to the reference signal. This faulty state can be detected by comparison of the values in the memory element 20 and 23 and further used to generate an alarm.

To protect the target digital circuit, the digital sensors triggers the alarm based on an alarm threshold selected arbitrarily in broad intervals. Accordingly, the target digital circuit operates with a much lower clock frequency than what it is really capable of handling, which results in low circuit performances.

SUMMARY

In order to address these and other problems, there is provided a calibration device as defined in the appended independent claim 1, and a method of calibrating a device as defined in appended claim 14 and a computer program as defined in appended claim 15. Preferred embodiments are defined in the dependent claims.

By optimizing the alarm threshold so as to confine it in smaller margins between the protection target critical path propagation delay and the alarm threshold and between the alarm threshold and clock period, greater performance is achieved and optimum security and safety is retained.

BRIEF DESCRIPTION OF THE DRAWINGS

The accompanying drawings, which are incorporated in and constitute a part of this specification, illustrate various embodiments of the invention and, together with the general description of the invention given above, and the detailed description of the embodiments given below, serve to explain the embodiments of the invention.

It is noted that the drawings of the invention are not necessarily to scale. The drawings are merely schematic representations. The drawings are intended to depict only typical embodiments of the invention, and therefore should not be considered as limiting the scope of the invention.

Additionally, the detailed description is supplemented with Exhibit A. This Exhibit is placed apart for the purpose of clarifying the detailed description, and of enabling easier reference. They nevertheless form an integral part of the description of the present invention. This applies to the drawings as well.

DETAILED DESCRIPTION

Figure 1:
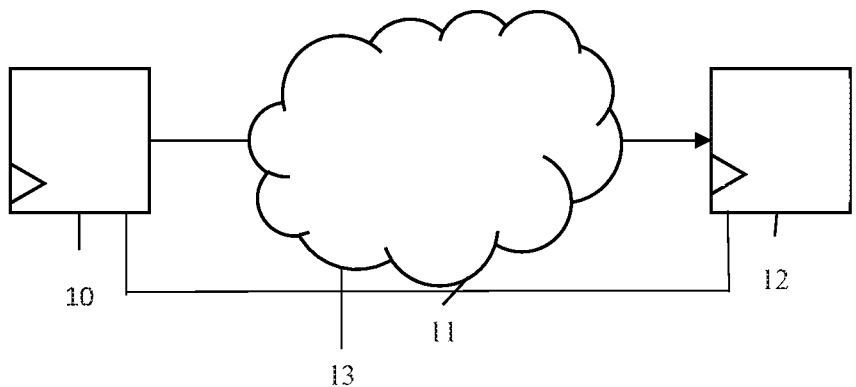
FIG. 1 is a schematic view of an exemplary digital circuit.
Figure 2:
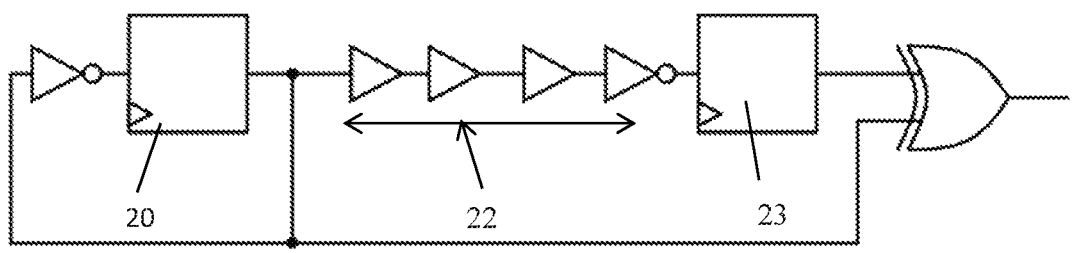
FIG. 2 is a schematic view of an exemplary digital sensor architecture.
Figure 3:
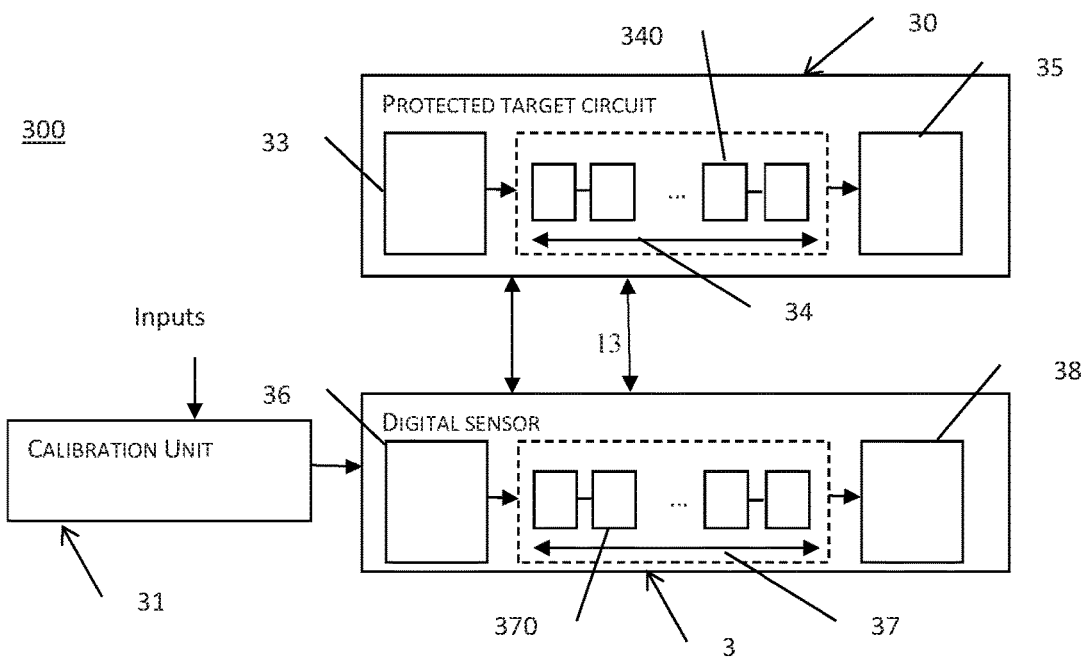
FIG. 3 is a diagrammatic view of a system for calibrating a digital sensor.

FIG. 3 represents a system 300 for dynamically optimizing a digital sensor 3, according to certain embodiments. The digital sensor 3 is configured to protect a digital circuit or sub-circuit 30 (also referred to as a "protection target" or "protected target") fed by a clock signal having a clock period by triggering an alarm depending on a triggering condition related to the clock period and to an optimal alarm threshold. The system 300 comprises a calibration device 31 configured to determine the optimal alarm threshold by minimizing a quantity depending on the probability of occurrence of false positives and the probability of occurrence of false negatives.

This allows for dynamically optimizing the digital sensor 3 to adjust to varying operating conditions. Varying operating conditions may comprise for example variation of the clock frequency due to smart power management. It is another advantage of the invention to lower the probability of false alarm when no critical operation is being performed, and to allow for a dynamic selection of a more security-wise stringent configuration otherwise.

The various embodiments of the invention may allow for optimizing the operation of the digital sensor whatever its sensitivity. Such sensitivity of a digital sensor may depend on its architectural parameters, and in particular on the propagation delay of standard cells in the digital sensor data path and/or on the number of cells in the digital sensor data path.

The digital sensor 3 may be used for example for detection of potentially malevolent attacks on the protection target 30. The target digital circuit 30 is schematically represented in FIG. 3. The target digital circuit 30 may comprise an input memory element 33 for storing input data, a data path 34 for propagating the input data and an output memory element 35 for storing the data propagated through the data path 34. The data path may comprise a number of combinatorial standard cells 340 responsible for computing the value to be stored in the output memory element 35. It should be noted that even if the digital sensor 3 and the target digital circuit 30 are represented as separate functional blocks in FIG. 3, in practice they may be implemented on a same circuit.

The digital sensor 3 thus provided satisfies a safety condition and a security condition. According to the safety condition, no false alarm should be raised by the digital sensor 3. Indeed, for some security-critical systems such an alarm may trigger the erasure of all valuable data in the protection target, thus stopping the protection target from functioning any longer. In other words, the safety condition defines that no alarm should be raised by the digital sensor unless the protection target is in out-of-specifications operating conditions. According to the security condition, no false negative should arise. In other words, in response to the successful creation of a faulty computation into the targeted digital circuit by an attacker, the digital sensor 3 can also be affected and raise an alarm to prevent the digital sensor from missing security events.

The calibration device 31 further allows for an optimization of the parameters of the digital sensor 3 so as to satisfy the safety condition and/or the security condition. The digital sensor's parameters may include for example the number of standard cells 370 in the digital sensor data path 37. The optimization of the number of standard cells 370 is such that the digital sensor data path propagation delay is optimized with respect to the safety and security conditions, applied on the protection target (digital circuit to be protected).

In some embodiments, the propagation delay in the critical path of the digital sensor 3 may be set to be greater than the propagation delay of the critical path 34 of the protection target 30, which allows satisfying the security condition. Accordingly, if a setup time violation arises in the protection target's critical path because the clock period is shortened, it will also occur in the digital sensor's data path.

Further, the data path propagation delay of the digital sensor 3 may be set to be smaller than the smallest acceptable clock period predefined by the protection target 300 (for example by the by the protection target's specifications), which allows satisfying the safety condition. As a result, if the digital sensor data path propagation delay is smaller than the smallest acceptable clock period as predefined by the protection target, no setup violation will arise in the digital sensor while operating under "normal" operating conditions, or equivalently no false alarm will arise.

The safety and security properties thus expressed consider setup time violations. However, safety and security properties may also be expressed for other type of violations, for example hold time violations. In the example of hold time violations, the security property would imply that an alarm is raised when the propagation delay in the digital sensor data path is smaller than a given threshold defined with respect to the protection target's shortest data path propagation delay. As a result, if a hold time violation arises in the protection target data path, it may also arise in the digital sensor which generates an alarm. Similarly, the safety property for hold time violations would imply that no alarm should be raised when the propagation delay in the protection target is above a specified threshold corresponding to normal operating conditions.

In the following detailed description, reference will be made to safety and security properties related to setup time violations for illustrative purpose only.

To facilitate the description of the various embodiments of the invention, the following notations are defined below:

$T_c$ designates critical path propagation delay of the protection target circuit 30;

$T_{clk}$ designates acceptable clock period of the protection target circuit 30 (predefined for example by the protection target's specifications);

$T_c^{w.c.}$ designates critical path propagation delay of the protection target circuit 30, according to worst case condition (i.e. highest value);

$T_{clk}^{w.c.}$ designates the minimum acceptable clock period of the protection target circuit 30 (predefined for example by the protection target's specifications);

$T_c^{b.c.}$ designates critical path propagation delay of the protection target circuit 30, according to best case condition (i.e. lowest value);

$T_{clk}^{b.c.}$ designates the maximum acceptable clock period of the protection target circuit 30 (predefined for example by the protection target's specifications); The critical path propagation delay of the digital sensor 3 will be referred to thereinafter as the "alarm threshold".

Figure 4:
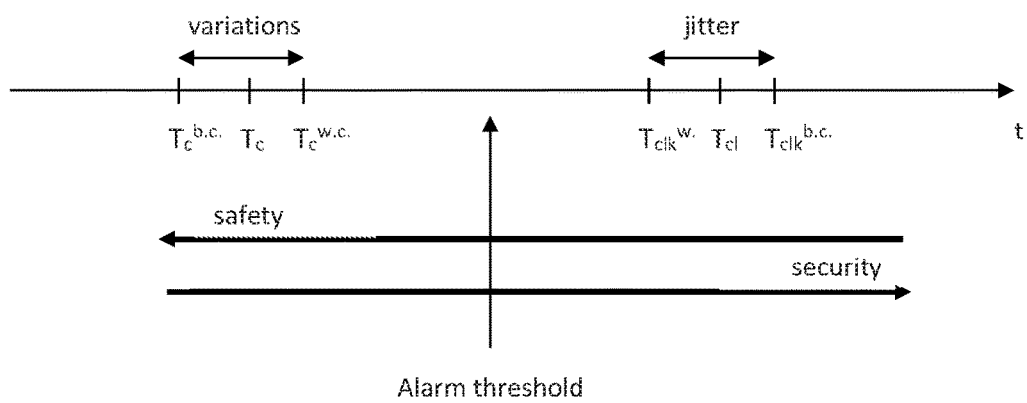
FIG. 4 is a schematic view representing the safety and security properties applied to a protection target.

FIG. 4 illustrates the Safety and security properties applied to a protection target 30.

The calibration device 31 may optimize the parameters of the digital sensor 3 by determining an optimal alarm threshold, thereby optimizing the security and safety conditions which may depend on several parameters, such as environmental variations (temperature, input voltage, input clock frequency), noise due to process variations (correlated, uncorrelated) or clock jitter as illustrated in FIG. 4. By optimally positioning the alarm threshold, the failures due to false alarm as well as false negative are highly limited.

A conventional approach may consist in arbitrarily defining the alarm threshold and using great margins between the protection target critical path propagation delay and the alarm threshold and between the alarm threshold and clock period, which provides low circuit performances. The calibration device 31 optimizes the alarm threshold in smaller margins which provides more confidence in the design and greater performances while retaining optimum security and safety.

To determine the optimal alarm threshold by minimizing the quantity depending on the probability of occurrence of false positives and the probability of occurrence of false negatives, the generation of the optimal alarm may take into account input data related to the protection target 30, silicon-related data (for example process variations, etc.) and a physical model of the minimization problem.

Additionally, the optimal alarm threshold can be determined by minimizing the quantity depending on the probability of occurrence of false positives and the probability of occurrence of false negatives. This quantity may further depend on other constraints related to power consumption, sensor gate count and surface, and/or resistance against aging effects. This can be achieved for example through the careful selection of the gates used for building the digital sensor data path.

More specifically, the digital sensor calibration unit 31 may minimize the quantity related to the probability of occurrence of false positives and the probability of occurrence of false negatives based on input parameters depending on:

one or more acceptable operating conditions predefined by the protection target 30, and/or one or more protection target timing characteristics such as the critical path propagation delays according to the acceptable operating conditions, and/or at least one physical model, and/or one or more weights quantifying the relative importance between the safety and security conditions.

In certain embodiments, the probability of false negatives may be determined from the probability density of the critical path propagation delay of the target digital circuit 30 and the probability density of the alarm threshold. Further, the probability of false positives may be determined from the probability density of the alarm threshold 30 and the probability density of said clock period of the target digital circuit.

Indeed, according to a given set of operating conditions (also referred to as the "corner"), the critical path propagation delay of the protection target 30, the data path propagation delay of the digital sensor 3 and/or the alarm threshold may behave as random variables with respective probability density functions $p_{T_c}$ and $p_{T_{alarm}}$. More specifically, every physical instance of a protection target 30 may behave according to $p_{T_c}$ for its critical path propagation delay, and every physical instance of a given digital sensor architecture with fixed parameters may behave according to $p_{T_{alarm}}$ for its alarm threshold. This phenomenon is due to noise sampling during the manufacturing process. In other words, parameters $T_c$ and $T_{alarm}$ may be determined once during the manufacturing process.

Similarly, the clock period may behave as a random variable according to a probability density function $p_{T_{clk}}$. The clock period may not only sample manufacturing noise but also dynamic noise. Therefore, in certain embodiments, $T_{clk}$ may be determined at every clock cycle.

Every probability density function $p_{T_c}$, $p_{T_{alarm}}$ and $p_{T_{clk}}$ may be characterized by its distribution, its mean value $\mu_{T_c}$, $\mu_{T_{alarm}}$, $\mu_{T_{clk}}$ respectively and by its standard deviation $\sigma_{T_c}$, $\sigma_{T_{alarm}}$ and $\sigma_{T_{clk}}$ respectively.

These probability density functions $p_{T_c}$, $p_{T_{alarm}}$ and $p_{T_{clk}}$ form the physical model. The parameters characterizing the physical model, such as the type of distributions, standard deviations ($\sigma_{T_c}$, $\sigma_{T_{alarm}}$ and $\sigma_{T_{clk}}$) and mean values ($\mu_{T_c}$, $\mu_{T_{alarm}}$, $\mu_{T_{clk}}$) may be determined by the manufacturing node and process, by standard cells library, by operating conditions and/or protection target timing characteristics. In the following description, the term "characterized model" will be used to refer to a model corresponding to a given set of manufacturing node, process, standard cells library, operating conditions and/or protection target timing characteristics.

Given a characterized model, the safety and security conditions may be expressed through the probability of false alarm $\mathbb{P}_{FA}$ and probability of false negative $\mathbb{P}_{FN}$, according to equations E1 and E2 respectively:

$$\mathbb{P}_{FA} = \int_{-\infty}^{+\infty} p_{T_{alarm}}(t_{alarm}) \int_{-\infty}^{t_{alarm}} p_{T_{clk}}(t_{clk}) dt_{clk} dt_{alarm} \quad (E1)$$

$$\mathbb{P}_{FN} = \int_{-\infty}^{+\infty} p_{T_{alarm}}(t_{alarm}) \int_{t_{alarm}}^{+\infty} p_{T_c}(t_c) dt_{clk} dt_{alarm} \quad (E2)$$

In certain embodiments, the optimal alarm threshold is determined from the sum of the probability of occurrence of false positives $\mathbb{P}_{FA}$ weighted by a first weight $\alpha$ and the probability of occurrence of false negatives $\mathbb{P}_{FN}$ weighted by a second weight $\beta$. The first weight and the second weight represent the relative weights $\alpha$ and $\beta$ of the safety and security conditions. In preferred embodiments, the first and second weights are positive values. In one exemplary embodiment, the first and second weights may be selected such that $\alpha = 1 - \beta$.

In one embodiment, the optimal alarm threshold $\bar{\mu}_{alarm}$ may be determined according to E3:

$$\bar{\mu}_{alarm} = \arg\min_{\mu_{alarm}} \alpha \mathbb{P}_{FN} + \beta \mathbb{P}_{FA} \quad (E3)$$

According to E3, the optimal alarm threshold is thus determined by minimizing the quantity $\alpha \mathbb{P}_{FN} + \beta \mathbb{P}_{FA}$.

The calibration device 31 may further compute the discrete number $\bar{n}$ of elementary gates, based on the theoretical mean propagation delay of each elementary logic gate in the digital sensor data path $\mu_d$ and on the optimal alarm threshold, when the sensor critical path of the digital sensor 3 comprises a set of elementary gates of a same type. In particular, the discrete number $\bar{n}$ of elementary gates may be determined according to the following equation:

$$\bar{n} = \left\lfloor \frac{\bar{\mu}_{alarm}}{\mu_d} + \frac{1}{2} \right\rfloor \tag{E4}$$

The optimization problem E3 can be rewritten according to the successive equations of exhibit A. This problem is usually convex for $\mu_{alarm} \in [\mu_{T_c}; \mu_{T_{clk}}]$ and can be solved either formally if the characterized physical model allows simplification of the equation, or numerically by means of a gradient descent for instance. Under this hypothesis, finding the optimum configuration may amount to finding the value for which the derivative of the minimization problem's cost function equals 0, and studying the sign of the derivative. As shown by Equation E3.7 of Exhibit A, the optimization problem amounts to finding the roots of a second order polynomial $ax^2+bx+c$, and studying the sign of the polynomial to identify the root corresponding to the minimum of the cost function.

As a first example, according to equation E3.7, if a=0, that is to say $\sigma_{T_{clk}}=\sigma_{T_c}=\sigma_{alarm}=\sigma$, the optimization problem has only the following solution:

$$\bar{\mu}_{alarm} = \frac{1}{2} \frac{\mu_{T_{clk}}^2 - \mu_{T_c}^2 + 2\sigma^2 \log\left(\frac{\beta}{\alpha}\right)}{\mu_{T_{clk}} - \mu_{T_c}} \tag{E4}$$

According to another example if a≠0, the sign of the discriminant $\Delta=b^2-4ac$ may be used to determine the optimal alarm threshold. Specifically:

If $\Delta<0$, the roots are complex and no solution can be found,

If $\Delta\geq 0$, there exists at least one solution. Generally $\sigma_{T_{clk}} < \sigma_{T_c}$ and therefore $$a = \left( \frac{1}{\sigma_{T_c}^2 + \sigma_{alarm}^2} - \frac{1}{\sigma_{T_{clk}}^2 + \sigma_{alarm}^2} \right) < 0.$$

In such case, the minimum of the cost function is found for $\bar{\mu}_{alarm}$ being the smallest root of the polynomial, that is if $\Delta>0$:

$$\bar{\mu}_{alarm} = \frac{b - \sqrt{\Delta}}{-2a} \tag{E5.1}$$

And if $a > 0$ $$\bar{\mu}_{alarm} = \frac{b + \sqrt{\Delta}}{-2a} \tag{E5.2}$$

And otherwise if $\Delta = 0$:

$$\bar{\mu}_{alarm} = -\frac{b}{2a}. \tag{E6}$$

Depending on the targeted manufacturing process, the technology node, the standard cells library and/or protection target's characteristics, a characterized model may be derived.

In one example, a case where $\sigma_{T_{clk}}=\sigma_{T_c}=\sigma_{alarm}$ and $\alpha=\beta$ is considered.

In such exemplary case, $\bar{\mu}_{alarm}$ is given by:

$$\bar{\mu}_{alarm} = \frac{1}{2} \frac{\mu_{T_{clk}}^2 - \mu_{T_c}^2 + 2\sigma^2 \log\left(\frac{\beta}{\alpha}\right)}{\mu_{T_{clk}} - \mu_{T_c}} \tag{E7.1}$$

$$\bar{\mu}_{alarm} = \frac{\mu_{T_{clk}} + \mu_{T_c}}{2} \tag{E7.2}$$

In this first example, the optimal alarm threshold position is in the middle of the time interval defined by $[\mu_{T_c}; \mu_{T_{clk}}]$.

In a second example, a model is used whereby both the protection target critical path propagation delay and the digital sensor alarm threshold follow a Gaussian distribution of same variance a and mean values $\mu_{T_c}$ and $\mu_{alarm}$ respectively. It is assumed that the clock period has no jitter, that is to say its probability density function has a zero variance $\sigma_{T_{clk}}=0$, that is to say the clock period is deterministic $T_{clk}=\mu_{T_{clk}}$. In the second example, $\alpha$ and $\beta$ are equal to ½ ($\alpha=\beta=\frac{1}{2}$).

The second example results in the following sequence of Equations:

$$\Delta = 4\left(\frac{\mu_{T_c}}{2} - \mu_{T_{clk}}\right)^2 - 2\left(\mu_{T_{clk}}^2 - \frac{\mu_{T_c}^2}{2} - \sigma^2 \log(2)\right) \tag{E8.1}$$

$$\Delta = \mu_{T_c}^2 + 4\mu_{T_{clk}}^2 - 4\mu_{T_c}\mu_{T_{clk}} - 2\mu_{T_{clk}}^2 + \mu_{T_c}^2 + 2\sigma^2 \log(2) \tag{E8.2}$$

$$\Delta = 2(\mu_{T_{clk}} - \mu_{T_c})^2 + 2\sigma^2 \log(2) \tag{E8.3}$$

$$x_1 = (2\mu_{T_{clk}} - \mu_{T_c}) - \sqrt{2(\mu_{T_{clk}} - \mu_{T_c})^2 + 2\sigma^2 \log(2)} \tag{E8.4}$$

$$x_2 = (2\mu_{T_{clk}} - \mu_{T_c}) + \sqrt{2(\mu_{T_{clk}} - \mu_{T_c})^2 + 2\sigma^2 \log(2)} \tag{E8.5}$$

As an example, for $\mu_{T_c}=2$ ns, $\mu_{T_{clk}}=4$ ns and $\sigma=80$ ps, equation E8.4 and E8.5 result respectively in:

$$x_1=3.17 \text{ ns} \in [\mu_{T_c}; \mu_{T_{clk}}] \tag{E8.6}$$

$$x_2=8.83 \text{ ns} > \mu_{T_{clk}} \tag{E8.7}$$

Accordingly, the optimal alarm is equal to $\bar{\mu}_{alarm}=3.17$ ns.

The digital sensor alarm threshold $\bar{\mu}_{alarm}$ can be determined statically during the design phase. Alternatively, it can be selected dynamically by software at runtime, for example in order to select the optimal configuration among a predetermined set of possible configurations, each possible configuration being associated with a predetermined characterized model. The digital sensor alarm threshold can be also determined dynamically by hardware at runtime, for example in order to select the optimal sensor configuration among a predetermined set of possible configurations, according to the current operating conditions and/or current protection target 30.

For example, such a dynamic calibration function could take as an input the list of enabled protection target modules and the current operating conditions, for example the clock period and temperature, and select the most appropriate predetermined configuration.

Figure 5:
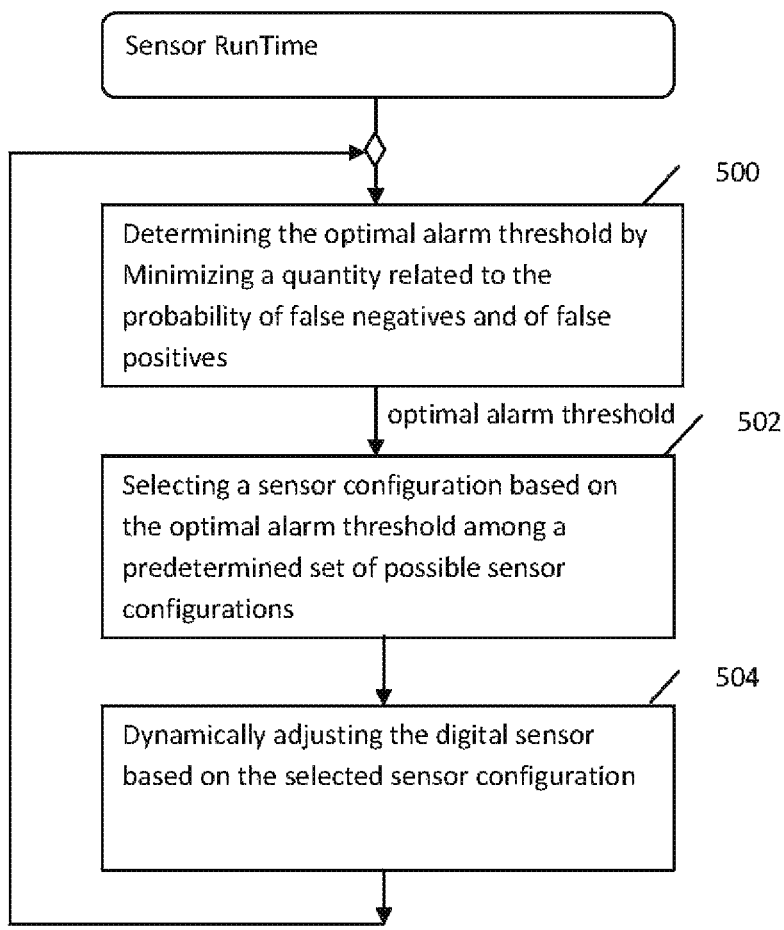
FIG. 5 is a flowchart depicting a process that may be executed to calibrate a digital sensor.

FIG. 5 is a flowchart depicting the method for dynamically calibrating the digital sensor according to certain embodiments, at runtime.

In block 500, the optimal alarm threshold is determined by minimizing a quantity related to the probability of false negatives and to the probability of false positives, for example by minimizing the sum of the probability of false negatives weighted by the first weight and probability of false positives weighted by the second weight.

In block 502, a sensor configuration is selected among a predetermined set of possible sensor configurations based on the optimal alarm threshold.

In block 504, the digital sensor is dynamically adjusted based on the selected configuration.

Figure 6:
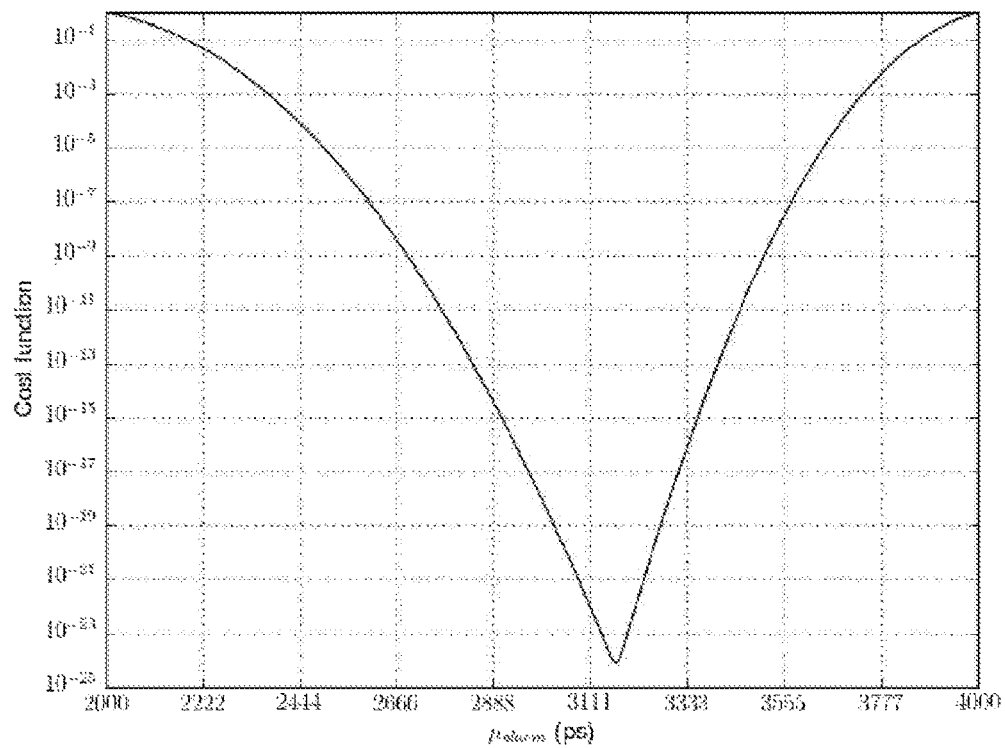
FIG. 6 is a diagram depicting the cost function as a function of the alarm threshold, according to an exemplary embodiment.

FIG. 6 shows a diagram representing the cost function between $\mu_{T_c}$ and $\mu_{T_{clk}}$, according to an exemplary implementation of the invention with $\mu_{T_c}$=2 ns, $\mu_{T_{clk}}$=4 ns, $\sigma$=80 ps and $\alpha=\beta$. This diagram graphically expresses the correctness of the results.

From the graph of the cost function represented in FIG. 6, it can be observed that, under such constraints, deviating from the optimal alarm threshold value results in a quickly increasing cost so that an arbitrary selection of the alarm threshold, like in conventional approaches, result in poor performance.

Figure 7:
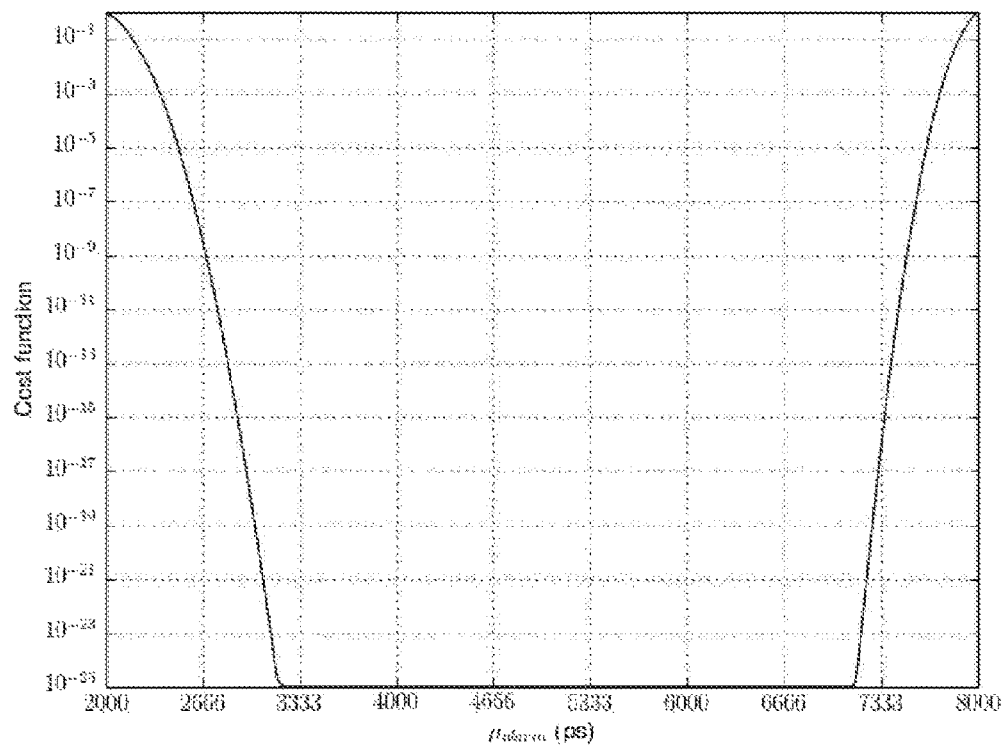
FIG. 7 is a diagram depicting the cost function as a function of the alarm threshold, according to another exemplary embodiment.

FIG. 7 shows a diagram representing the cost function between $\mu_{T_c}$ and $\mu_{T_{clk}}$, according to another exemplary implementation of the invention with $\mu_{T_c}$=2 ns, $\mu_{T_{clk}}$=8 ns, $\sigma$=80 ps and $\alpha=\beta$. From this graph of the cost function with $\mu_{T_{clk}}$=8 ns, it can be observed that the increased margins provide more room for deviation and error from the optimal alarm threshold. Indeed, deviating from an optimal value would not result in too dramatic an increase of the cost function. However, under such conditions the circuit functions is at a half the frequency as compared to the diagram of in FIG. 4.

While embodiments of the invention have been illustrated by a description of various examples, and while these embodiments have been described in considerable detail, it is not the intention of the applicant to restrict or in any way limit the scope of the appended claims to such detail. In particular, the invention is not limited to a particular architecture of the digital circuit and/or of the digital sensor, and more specifically to a particular types of elementary gates in the sensor data path. Further, the invention may be also used for calibrating a hold time violation sensor, by studying the margins between the clock period, the alarm threshold and the protection target's shortest path propagation delay.

It should be also noted that the operating conditions and/or environmental parameters may vary locally. This situation may occur for example because of malevolent actions such as local fault injection (including for instance laser injection, EM injection, body bias, etc.) or because of side effects of the circuit's operations (such as local voltage drop also called "IR drop"). It is an advantage of the invention to make it possible to place multiple optimized digital sensor instances over the chip to improve coverage relative to such local operating conditions variations. It should be further noted that the positioning of the digital sensors may be of importance. Indeed, it has been determined that on a digital sensor array implemented on a FPGA device, some sensors are significantly more sensitive than others to local operating conditions variations. This may originate from the geometry of the device, including the power/ground network topology and/or the geometry of manufacturing process of the device. Local operating conditions variations may be characterized either experimentally, for example by performing local fault injection cartography and measuring a digital sensor array's response, or through simulation tools. In particular, simulation tools can be used to predict local voltage drops ("IR drops"), but could also be used for characterizing local fault injection effects. In some embodiments, local operating conditions variation characterization can be used to select an optimized number of digital sensors and optimal placement for a given local operating conditions variations coverage target. Also, programmable circuits implementing dynamic partial reconfiguration may be used to select the optimal placement and the number of sensors after the chip is manufactured in order to select the optimal configuration in terms of local operating conditions variation coverage to the application currently running on the device. Such dynamic partial reconfiguration functionalities can be found in some families of FPGA devices. The selection of the optimal digital sensor instances number and placement may also take into account the targeted power consumption for the device, as well as the targeted security level.

Additional advantages and modifications will readily appear to those skilled in the art. The invention in its broader aspects is therefore not limited to the specific details, representative methods, and illustrative examples shown and described. Accordingly, departures may be made from such details without departing from the spirit or scope of applicant's general inventive concept.

Embodiments of the present invention can take the form of an embodiment containing both hardware and software elements.

Furthermore, the calibration methods described herein can be implemented by computer program instructions supplied to the processor of any type of computer to produce a machine with a processor that executes the instructions to implement the functions/acts specified herein. These computer program instructions may also be stored in a computer-readable medium that can direct a computer to function in a particular manner. To that end, the computer program instructions may be loaded onto a computer to cause the performance of a series of operational steps and thereby produce a computer implemented process such that the executed instructions provide processes for implementing the functions/acts specified herein.

Exhibit A—Minimization Problem

The optimization problem E3 can be rewritten as:

$$\overline{\mu}_{alarm} = \arg\min_{\mu_{alarm}} \int_{-\infty}^{+\infty} p_{T_{alarm}}(t_{alarm}, \mu_{alarm})$$
$$\left( \beta \int_{-\infty}^{t_{alarm}} p_{T_{clk}}(t_{clk}) dt_{clk} + \alpha \int_{t_{alarm}}^{+\infty} p_{T_c}(t_c) dt_c \right) dt_{alarm}$$

By expanding the first integral and assuming that the probability density functions are Gaussian, this provides:

$$\overline{\mu}_{alarm} = \arg\min_{\mu_{alarm}} \beta \int_{-\infty}^{+\infty} p_{T_{alarm}}(t_{alarm}, \mu_{alarm}) \quad \text{(E3.1)}$$

$$\int_{-\infty}^{t_{alarm}} p_{T_{clk}}(t_{clk})dt_{clk}\,dt_{alarm} +$$

$$\alpha \int_{-\infty}^{+\infty} p_{T_{alarm}}(t_{alarm}, \mu_{alarm}) \int_{t_{alarm}}^{+\infty} p_{T_c}(t_c)dt_c\,dt_{alarm} =$$

$$\arg\min_{\mu_{alarm}} \beta \int_{-\infty}^{+\infty} p_{T_{alarm}}(t_{alarm}, \mu_{alarm})$$

$$\frac{1 + \mathrm{erf}\left(\frac{t_{alarm} - \mu_{T_{clk}}}{\sqrt{2}\,\sigma_{T_{clk}}}\right)}{2} dt_{alarm} +$$

$$\alpha \int_{-\infty}^{+\infty} p_{T_{alarm}}(t_{alarm}, \mu_{alarm})$$

$$\frac{1 - \mathrm{erf}\left(\frac{t_{alarm} - \mu_{T_c}}{\sqrt{2}\,\sigma_{T_c}}\right)}{2} dt_{alarm}$$

(E3.2)

$$\overline{\mu}_{alarm} =$$

$$\arg\min_{\mu_{alarm}} \beta \int_{-\infty}^{+\infty} \frac{1}{\sqrt{2\pi}\,\sigma_{alarm}} e^{-\frac{(t_{alarm}-\mu_{alarm})^2}{2\sigma_{alarm}^2}} \frac{1 + \mathrm{erf}\left(\frac{t_{alarm}-\mu_{T_{clk}}}{\sqrt{2}\,\sigma_{T_{clk}}}\right)}{2} dt_{alarm} +$$

$$\alpha \int_{-\infty}^{+\infty} \frac{1}{\sqrt{2\pi}\,\sigma_{alarm}} e^{-\frac{(t_{alarm}-\mu_{alarm})^2}{2\sigma_{alarm}^2}} \frac{1 - \mathrm{erf}\left(\frac{t_{alarm}-\mu_{T_c}}{\sqrt{2}\,\sigma_{T_c}}\right)}{2} dt_{alarm} =$$

$$\arg\min_{\mu_{alarm}} \beta \int_{-\infty}^{+\infty} \frac{1}{\sqrt{2\pi}\,\sigma_{alarm}} e^{-\frac{(t_{alarm}-\mu_{alarm})^2}{2\sigma_{alarm}^2}} \mathrm{erf}\left(\frac{t_{alarm}-\mu_{T_{clk}}}{\sqrt{2}\,\sigma_{T_{clk}}}\right)$$

$$t_{alarm} - \alpha \int_{-\infty}^{+\infty} \frac{1}{\sqrt{2\pi}\,\sigma_{alarm}} e^{-\frac{(t_{alarm}-\mu_{alarm})^2}{2\sigma_{alarm}^2}} \mathrm{erf}\left(\frac{t_{alarm}-\mu_{T_c}}{\sqrt{2}\,\sigma_{T_c}}\right) dt_{alarm}$$

By noting $$z_1 = \frac{t_{alarm} - \mu_{T_{clk}}}{\sqrt{2}\,\sigma_{T_{clk}}}$$

and $$z_2 = \frac{t_{alarm} - \mu_{T_c}}{\sqrt{2}\,\sigma_{T_c}},$$

then $dt_{alarm} = \sqrt{2}\,\sigma_{T_{clk}} dz_1$ and $dt_{alarm} = \sqrt{2}\,\sigma_{T_c} dz_2$, which leads to E3.3:

$$\overline{\mu}_{alarm} = \arg\min_{\mu_{alarm}} \beta\sqrt{2}\,\sigma_{T_{clk}} \int_{-\infty}^{+\infty} \frac{1}{\sqrt{2\pi}\,\sigma_{alarm}} \quad \text{(E3.3)}$$

$$e^{-\left(\frac{z_1\sqrt{2}\,\sigma_{T_{clk}}}{\sqrt{2}\,\sigma_{alarm}} + \frac{\mu_{T_{clk}} - \mu_{alarm}}{\sqrt{2}\,\sigma_{alarm}}\right)^2} \mathrm{erf}(z_1)dz_1 -$$

$$\alpha\sqrt{2}\,\sigma_{T_c} \int_{-\infty}^{+\infty} \frac{1}{\sqrt{2\pi}\,\sigma_{alarm}} e^{-\left(\frac{z_2\sqrt{2}\,\sigma_{T_c}}{\sqrt{2}\,\sigma_{alarm}} + \frac{\mu_{T_c} - \mu_{alarm}}{\sqrt{2}\,\sigma_{alarm}}\right)^2} \mathrm{erf}(z_2)dz_2$$

As $$\frac{1}{\sqrt{2\pi}\,\sigma_{alarm}} > 0$$

and since a minimum is sought, this constant can be removed from the two integrals.

Further, as $$\int_{-\infty}^{+\infty} \mathrm{erf}(x) e^{-(ax+b)^2} dx = -\frac{\sqrt{\pi}}{a}\mathrm{erf}\left(\frac{b}{\sqrt{a^2+1}}\right)$$

for $\mathcal{R}(a^2) > 0$, $\mathcal{R}$ being the real part, the optimal alarm threshold can be reformulated according to E.3.4:

$$\overline{\mu}_{alarm} = \quad \text{(E3.4)}$$

$$\arg\min_{\mu_{alarm}} \alpha\,\mathrm{erf}\left(\frac{\mu_{T_c} - \mu_{alarm}}{\sqrt{2(\sigma_{T_c}^2 + \sigma_{alarm}^2)}}\right) - \beta\,\mathrm{erf}\left(\frac{\mu_{T_{clk}} - \mu_{alarm}}{\sqrt{2(\sigma_{T_{clk}}^2 + \sigma_{alarm}^2)}}\right)$$

As the problem is usually convex, for $\mu_{alarm} \in [\mu_{T_c}; \mu_{T_{clk}}]$, finding the optimum configuration may amount to finding the value for which the derivative of the minimization problem's cost function equals 0, and studying the sign of the derivative. Thus, the values of $\mu_{alarm}$ that are to be found satisfy the following property E3.5:

$$\left(-\beta\frac{d}{d\mu_{alarm}}\mathrm{erf}\left(\frac{\mu_{T_{clk}} - \mu_{alarm}}{\sqrt{2(\sigma_{T_{clk}}^2 + \sigma_{alarm}^2)}}\right) + \right. \quad \text{(E3.5)}$$

$$\left. \alpha\frac{d}{d\mu_{alarm}}\mathrm{erf}\left(\frac{\mu_{T_c} - \mu_{alarm}}{\sqrt{2(\sigma_{T_c}^2 + \sigma_{alarm}^2)}}\right)\right) > 0$$

Which is equivalent to equation E3.6:

$$e^{-\frac{1}{2}\left[\left(\frac{\mu_{T_{clk}} - \mu_{alarm}}{\sqrt{\sigma_{T_{clk}}^2 + \sigma_{alarm}^2}}\right)^2 - \left(\frac{\mu_{T_c} - \mu_{alarm}}{\sqrt{\sigma_{T_c}^2 + \sigma_{alarm}^2}}\right)^2\right]} > \frac{\alpha}{\beta}\frac{\sqrt{\sigma_{T_{clk}}^2 + \sigma_{alarm}^2}}{\sqrt{\sigma_{T_c}^2 + \sigma_{alarm}^2}} \quad \text{(E3.6)}$$

By composing the both terms of E3.6 by the strictly increasing function $x \to \log(x)$, this leads to E3.7:

$$\left(\frac{1}{\sigma_{T_c}^2 + \sigma_{alarm}^2} - \frac{1}{\sigma_{T_{clk}}^2 + \sigma_{alarm}^2}\right)\mu_{alarm}^2 + \quad \text{(E3.7)}$$

$$2\left(\frac{\mu_{T_{clk}}}{\sigma_{T_{clk}}^2 + \sigma_{alarm}^2} - \frac{\mu_{T_c}}{\sigma_{T_c}^2 + \sigma_{alarm}^2}\right)\mu_{alarm} + \left(\frac{\mu_{T_c}^2}{\sigma_{T_c}^2 + \sigma_{alarm}^2} - \frac{\mu_{T_{clk}}^2}{\sigma_{T_{clk}}^2 + \sigma_{alarm}^2} + 2\log\left(\frac{\beta}{\alpha}\frac{\sqrt{\sigma_{T_c}^2 + \sigma_{alarm}^2}}{\sqrt{\sigma_{T_{clk}}^2 + \sigma_{alarm}^2}}\right)\right) > 0$$

The invention claimed is:

1. A calibration device for calibrating a digital sensor, said digital sensor being configured to protect a target digital circuit fed by a clock signal having a clock period by triggering an alarm depending on a triggering condition related to said clock period and to an optimal alarm threshold, said optimal alarm threshold being determined by minimizing a quantity depending on the probability of occurrence of false positives and on the probability of occurrence of false negatives.

2. The calibration device of claim 1, wherein the probability of false negatives is determined from the probability density of the critical path propagation delay of the target digital circuit and the probability density of the alarm threshold.

3. The calibration device of claim 2, wherein the probability of false negatives is determined according to the following equation:

$$\mathbb{P}_{FN} = \int_{-\infty}^{+\infty} p_{T_{alarm}}(t_{alarm}) \int_{t_{alarm}}^{+\infty} p_{T_c}(t_c) dt_c dt_{alarm}$$

where $t_{alarm}$ designates the alarm threshold, $p_{T_{alarm}}$ designates the probability density of the alarm threshold, $t_c$ designates the critical path propagation delay of the target digital circuit, and $p_{T_c}$ designates the probability density of the critical path propagation delay of the target digital circuit.

4. The calibration device of claim 1, wherein the probability of false positives is determined from the probability density of the alarm threshold and the probability density of said clock period of the target digital circuit.

5. The calibration device of claim 4, wherein the probability of false positives is determined according to the following equation:

$$\mathbb{P}_{FA} = \int_{-\infty}^{+\infty} p_{T_{alarm}}(t_{alarm}) \int_{-\infty}^{t_{alarm}} p_{T_{clk}}(t_{clk}) dt_{clk} dt_{alarm}$$

where $t_{alarm}$ designates the alarm threshold, $p_{T_{alarm}}$ designates the probability density of the alarm threshold, $p_{T_{clk}}$ designates the probability density of the clock period and $t_{clk}$ designates the clock period.

6. The calibration device of claim 1, wherein said quantity depends on the sum of the probability of occurrence of false positives $\mathbb{P}_{FA}$ weighted by a first weight and the probability of occurrence of false negatives $\mathbb{P}_{FN}$ weighted by a second weight.

7. The calibration device of claim 1, wherein said optimal alarm threshold $\bar{\mu}_{alarm}$ is determined according to the following equation:

$$\bar{\mu}_{alarm} = \arg\min_{\mu_{alarm}} \alpha \mathbb{P}_{FN} + \beta \mathbb{P}_{FA},$$

in which $\mathbb{P}_{FA}$ designates the probability of occurrence of false positives, α designates the first weight, $\mathbb{P}_{FN}$ designates the probability of occurrence of false negatives, and β designates the a second weight.

8. The calibration device of claim 1, wherein said optimal alarm threshold is determined dynamically during the operation of the digital sensor based on a current operating condition and the critical path propagation delay of the target digital circuit.

9. The calibration device of claim 1, wherein the digital sensor comprises a sensor critical path comprising a set of elementary gates, said elementary gates being of a unique type, and wherein the number of elementary gates is determined from said optimal alarm threshold and the digital sensor data path.

10. The calibration device of claim 9, wherein said number of elementary gates $\bar{n}$ is determined from the optimal alarm threshold $\bar{\mu}_{alarm}$ according to the following equation:

$$\bar{n} = \left\lfloor \frac{\bar{\mu}_{alarm}}{\mu_d} + \frac{1}{2} \right\rfloor,$$

in which $\mu_d$ designates the digital sensor data path elementary gate mean delay.

11. The calibration device of claim 2 wherein each probability density follows a Gaussian distribution.

12. The calibration device of claim 11, wherein each probability density comprises a mean value and a variance, wherein if the probability density variances are all equal, and the optimal alarm threshold is determined between the mean value $\mu_{T_c}$ of the probability density of the critical path propagation delay of the target digital circuit (30) and the mean value $\mu_{T_{clk}}$ of the probability density of the clock period of the target digital circuit.

13. The calibration device of claim 1, wherein said triggering condition is verified if said optimal alarm threshold exceeds the clock period.

14. A calibration method for calibrating a digital sensor, said digital sensor being configured to protect a target digital circuit fed by a clock signal having a clock period, by triggering an alarm depending on a condition between said clock signal and an optimal alarm threshold, said method comprising determining said optimal alarm threshold by minimizing a quantity depending on the probability of occurrence of false positives and the probability of occurrence of false negatives.

15. A computer program product comprising:
a non-transitory computer readable storage medium; and
instructions stored on the non-transitory computer readable storage medium that, when executed by a processor, cause the processor to calibrate a digital sensor, said digital sensor being configured to protect a target digital circuit fed by a clock signal having a clock period, by triggering an alarm depending on a condition between said clock signal and an optimal alarm threshold, said calibration of the digital sensor comprising determining said optimal alarm threshold by minimizing a quantity depending on the probability of occurrence of false positives and the probability of occurrence of false negatives.

* * * * *